United States Patent [19]
Wada

[11] Patent Number: 5,254,417
[45] Date of Patent: Oct. 19, 1993

[54] REFLECTION MASK AND ELECTRICALLY CHARGED BEAM EXPOSING APPARATUS USING THE REFLECTION MASK

[75] Inventor: Hirotsugu Wada, Tokyo, Japan

[73] Assignee: Kabushiki Kaisha Toshiba, Kawasaki, Japan

[21] Appl. No.: 760,913

[22] Filed: Sep. 17, 1991

[30] Foreign Application Priority Data

Sep. 28, 1990 [JP] Japan .................... 2-256960

[51] Int. Cl.⁵ .............................. G03F 9/00
[52] U.S. Cl. ........................ 430/5; 430/311; 250/492.2; 250/396 R; 250/398
[58] Field of Search ............... 430/5, 311; 250/492.2, 250/396 R, 398

[56] References Cited

U.S. PATENT DOCUMENTS 5,036,209 7/1991 Kataoka et al. .............. 250/492.2
5,130,213 7/1992 Berger et al. ..................... 430/5

FOREIGN PATENT DOCUMENTS 0092873 11/1983 European Pat. Off. .
2461281 1/1981 France .
5329080 8/1976 Japan .

OTHER PUBLICATIONS

Patent Abstracts of Japan, vol. 2, No. 90 (E-78) (4182), Jul. 22, 1978, & JP-A-53 054 974, May 18, 1978, H. Shibata, "Electron Beam Exposure System".

Primary Examiner—Marion E. McCamish
Assistant Examiner—Mark A. Chapman
Attorney, Agent, or Firm—Oblon, Spivak, McClelland, Maier & Neustadt

[57] ABSTRACT

A reflection mask has a reflection pattern which is formed on a required portion of the surface of a substrate and on which a voltage sufficient to reflect incident electrically charged beams is applied, and a non-reflection pattern which is formed on the other portion of surface of the substrate and on which a voltage sufficient to emit the electrically charged beams to the non-reflection pattern is applied.

9 Claims, 11 Drawing Sheets

REFLECTION MASK AND ELECTRICALLY CHARGED BEAM EXPOSING APPARATUS USING THE REFLECTION MASK

BACKGROUND OF THE INVENTION

1. Field of the Invention

This invention relates to a reflection mask, and an electrically charged beam exposing apparatus used for manufacturing semiconductor devices and more particularly to an electrically charged beam exposing apparatus using a reflection mask.

2. Description of the Related Art

It has become necessary to expose patterns of less than 0.2 μm on specimens in order to continue the development and research of highly technological devices employing highly developed LSIs in the future. However, it is impossible to expose such patterns on specimens by using the light exposing technology practiced in the recent production lines. Therefore, charged beam exposing apparatuses having high resolving powers, such as an electron beam exposure apparatus, are used to expose such fine patterns. In particular, relatively high throughputs are obtained by the use of electron beam apparatuses of variable shape type. The reason why such high throughputs are obtained is that electron beams are shaped as a rectangular or triangular aperture image by a shape aperture member to expose a required pattern.

Figure 1:
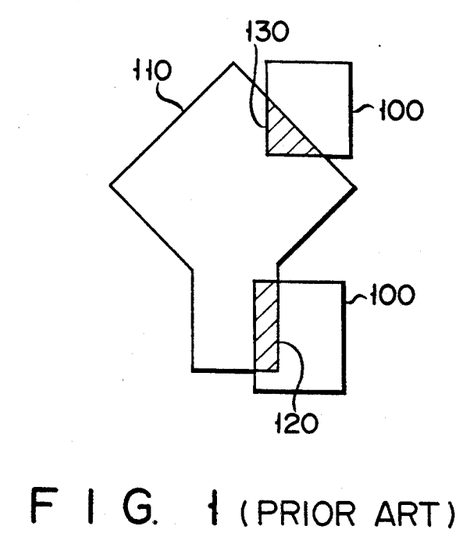
FIG. 1 is a schematic view of a method to produce variable shaped beams by means of a conventional electron beam exposing apparatus of a variable shaped beam type.

FIG. 1 schematically shows how to expose resultant patterns by means of a variable shape type electron beam exposing apparatus. First rectangular aperture image 100 is projected on a second arrow-shaped aperture 110 by deflecting electron beams and the electron beams are limited to be incident on a rectangular portion 120 or triangular portions 130 which expose patterns in a specimen surface. The size of the aperture is several μm to several tens of μm. The electron beams selected and shaped as mentioned above are normally cut scale down to 1/20 to 1/40 and are projected on the surface of the specimen.

In the development of devices of 1G (one giga) grade, the technique as shown in FIG. 1 is impractical when exposure time is considered because the shapes of cross sections of the selected beams are limited to several shapes and further exposure must be repeated several times in order to obtain a required exposure pattern.

Figure 2:
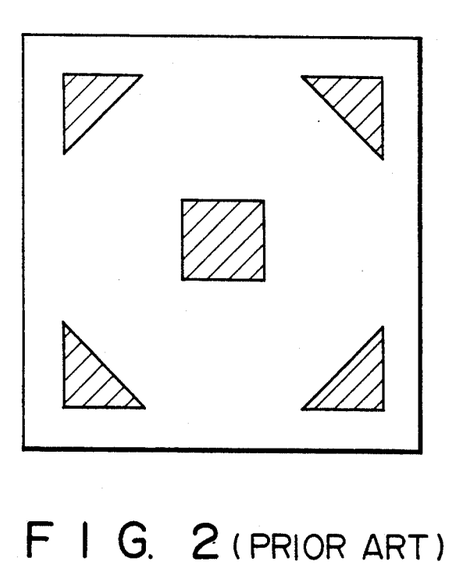
FIG. 2 illustrates the cross-sectional shapes of electrically charged beam which can be produced by the conventional variable shaped electron beam exposing apparatus.
Figure 3:
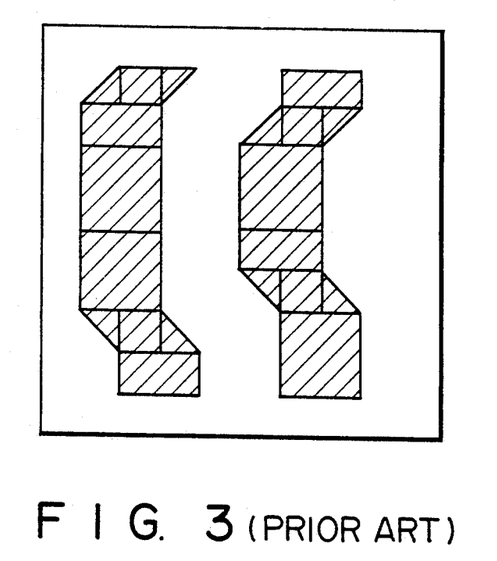
FIG. 3 illustrates how to expose patterns of the cell unit of a DRAM by a conventional variable shaped electron beam exposing apparatus.

FIG. 2 is a schematic view of the shapes of the cross section of beams produced by the conventional electron beam exposing apparatus mentioned above in which only five limited shapes are obtained. The method of exposure will now be shown by using the cell portion of a DRAM with reference to FIG. 3. A pattern in the cell portion consists of sets of the fundamental shapes as shown in FIG. 2. A pattern is divided as shown in FIG. 3 and the divided portions are exposed in succession. The exposure of 20 shots per pattern is performed in the sample as shown in FIG. 3. Therefore, 20G shots are required for exposing the cell portion of a DRAM of 1G grade. Even when a high sensitive resist having a sensitivity of 5 μC/cm$^2$ is used at a high current density of 50 A/cm$^2$ to shorten the exposure time, it takes 35 minutes for a chip to be exposed. In this respect, it takes about 60 hours for 100 chips on the overall area of the wafer to be exposed. Consequently, two months are required to expose one lot consisting of 24 wafers. When peripheral circuits which are arranged irregularly are included, more than four months is required to perform exposure.

This problem can be solved by performing exposure by using a shape aperture having holes of the same shape as the required exposure pattern. In the case of using an aperture which has the same shape as that of the cell of the DRAM as shown in FIG. 3, each cell is exposed by a single exposure, and the exposure time is reduced to less than 1/20 and thus exposure is made in a practical time.

The exposing method using the cell shaped aperture, however, encountered with the following difficulty:

In order to obtain electron beams of an arbitrary shape in accordance with the shape of an exposure pattern, holes having a large number of shapes and a dimensional accuracy of 0.1 μm must be arranged in the shape aperture. However, the holes cannot be arranged at a practical pitch of, for example, 100 μm, because the holes can not be made as donut-like openings.

Figure 4:
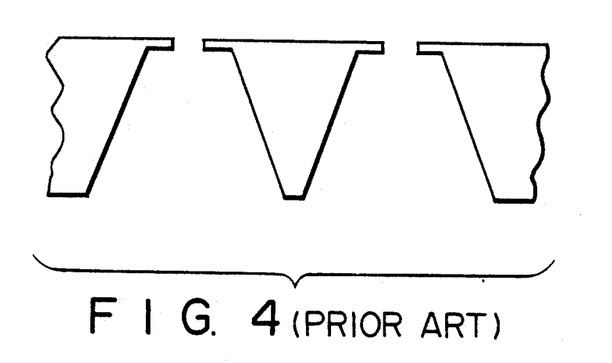
FIG. 4 is a cross-sectional view of apertures formed by wet etching.

Apertures are generally manufactured by forming through holes having a required shape in base material such as metal plates or silicon wafers by means of machining or an LSI process. Since distortion occurs by the machining process, the number of holes formed in an aperture member is limited to a small number such as one or two. Thus, it is difficult to form an aperture having a required shape in the base material. Further, the accuracy attained by machining process is about 0.4 μm. On the other hand, by the etching technique using plasma or ions in the normal LSI process, the surface of each silicon wafer can be processed at an accuracy of about 0.1 μm so as to obtain a required shape. But the depth processing is limited to several tens of μm. Thus only a very thin aperture can be formed. In order to fix an aperture to a holder, the portions of the aperture other than holes must have a thickness of several hundred μm and thus the holes are formed at the bottom of the wafer by means of wet etching such as the KOH method. FIG. 4 shows the cross-sectional view of apertures formed by means of the wet etching. As shown in FIG. 4, however, the etched side portion has about the same length as the etched depth, and it is difficult to arrange the holes at a pitch of 1 mm or less. Such an aperture cannot be practically used because the beams must be deflected or the aperture must be moved by 1 mm or more.

The prior art related to this invention is further disclosed in Japanese Laid-open Patent Application No. 53-29080.

The above discussion is not only applicable to electron beam exposing apparatus but also to any types of electrically charged exposing apparatus.

Since the shapes of the cross sections of the electrically charged beam is limited as explained above, the apparatus is encountered with the problem that it takes a long time to expose patterns in highly technological devices. This problem can be solved if holes having quite a large number of arbitrary shapes for shaping beams arbitrarily are arranged in the aperture member. However, it is difficult to arrange these holes accurately at a practical pitch.

SUMMARY OF THE INVENTION

The object of this invention is to provide a reflection mask and an electrically charged beam exposing apparatus.

According to a first aspect of this invention, a reflection mask comprises a reflection pattern on which a first electrically charged beam is irradiated and a sufficient voltage for the reflection of the first electrically charged beam is applied, and a non-reflection pattern on which the electrically charged beam is exposed and a sufficient voltage for the absorption of the electrically charged beam is applied and is formed on a portion of the reflection mask other than the reflection pattern.

On the reflection mask, the electrically charged beam is reflected by the reflection pattern, and the electrically charged beam is absorbed by the non-reflection pattern. Consequently, the reflection mask performs the same function as the shape aperture of an electrically charged beam exposing apparatus such that the electrically charged beam reflected by the reflection pattern can be used for exposure. Since the reflection pattern can be formed accurately by a conventional LSI processor into arbitrary shapes with practical pitch, the electrically charged beam can be arbitrarily shaped.

According to a second aspect of this invention, an electrically charged beam exposing apparatus comprises a reflection mask having an electrically charged beam irradiating unit for irradiating an electrically charged beam, an electrically charged beam shaping unit for shaping the cross section of the electrically charged beam irradiated from the electrically charged beam irradiating unit into a predetermined shape, a reflection pattern to which the electrically charged beam is exposed and a sufficient voltage for the reflection of the electrically charged beams is applied, and a non-reflection pattern to which the electrically charged beam is irradiated and which is formed on part of the surface of the reflection mask other than the reflection pattern, and a specimen loader unit for receiving a specimen to which the electrically charged beam reflected by the reflection pattern is irradiated.

After being shaped by the electrically charged beam shaping unit, the electrically charged beam irradiated therefrom is incident on the reflection mask, and then is reflected by the reflection pattern, and exposes the specimen set on the specimen loader. Accordingly, the specimen can be illuminated with the electrically charged beam shaped into an arbitrary configuration, whereby the exposure time for the specimen is made much shorter than that in the conventional method in which the electrically charged beam having the limited shapes in cross section are irradiated on the specimen. Further, reflection patterns are arranged at a practical pitch on the reflection mask such that the shape of the beam is easily selected by deflection.

According to a third aspect of this invention, an electrically charged beam exposing apparatus comprises an electrically charged beam irradiating unit for an irradiating electrically charged beam, an electrically charged beam shaping unit for shaping the electrically charged beam irradiated from the electrically charged beam shaping unit, an electrically charged beam deflecting unit provided in an irradiating path of the electrically charged beam shaped by the electrically charged beam shaping unit, for changing the irradiating direction of the electrically charged beam, a reflection mask illuminated with the electrically charged beam whose irradiating direction is changed by the electrically charged beam deflecting unit, for reflecting the electrically charged beam having predetermined shapes in cross section to the electrically charged beam deflecting unit, and a specimen loader for receiving a specimen to which the electrically charged beam whose irradiating direction has been changed again is irradiated.

After being shaped into the predetermined shape by the electrically charged beam shaping unit and changed in its direction by the electrically charged beam deflecting unit, the electrically charged beam is incident vertically on the reflection mask. The electrically charged beam reflected by the reflection mask with the predetermined shape in cross section are is incident on the electrically charged beam deflecting unit again and changes to irradiating direction by means of the electrically charged beam deflecting unit to be irradiated to the specimen. Consequently, even if plano-parallel beams are incident vertically on the reflection mask, no obstruction occurs to the beams in the irradiating path. Further, the exposure time for a specimen is greatly shortened.

To sum up, the electrically charged beam can be shaped into an arbitrary configuration by means of a reflection mask according to this invention, and furthermore, the exposure time for a specimen can be made greatly shorter by means of an electrically charged beam exposing apparatus according to this invention than by means of conventional means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiment 1

Figure 5A:
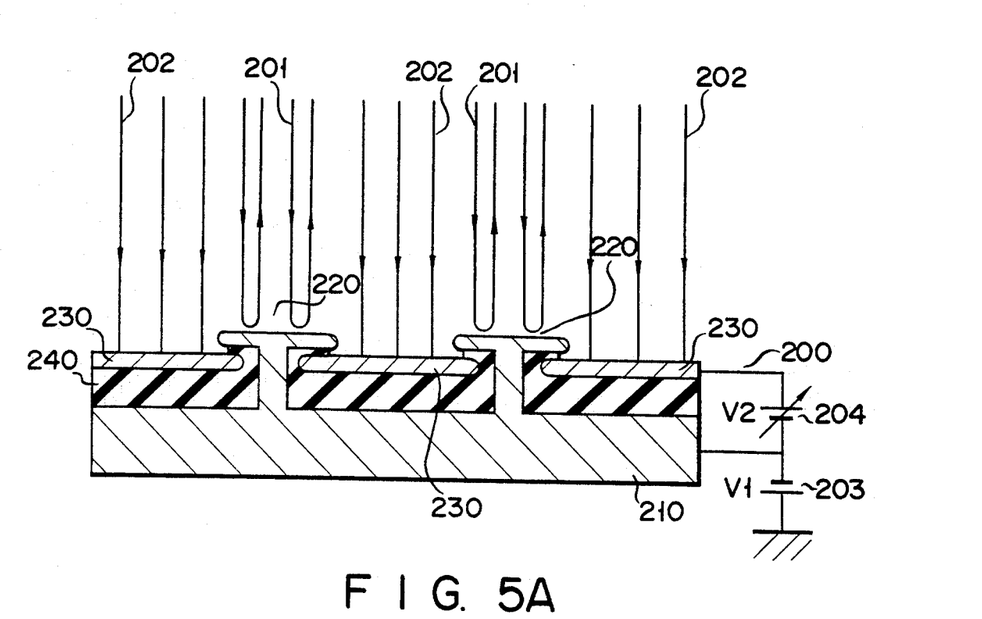
FIGS. 5A and 5B are cross-sectional views of one embodiment of a reflection mask according to this invention.
Figure 5B:
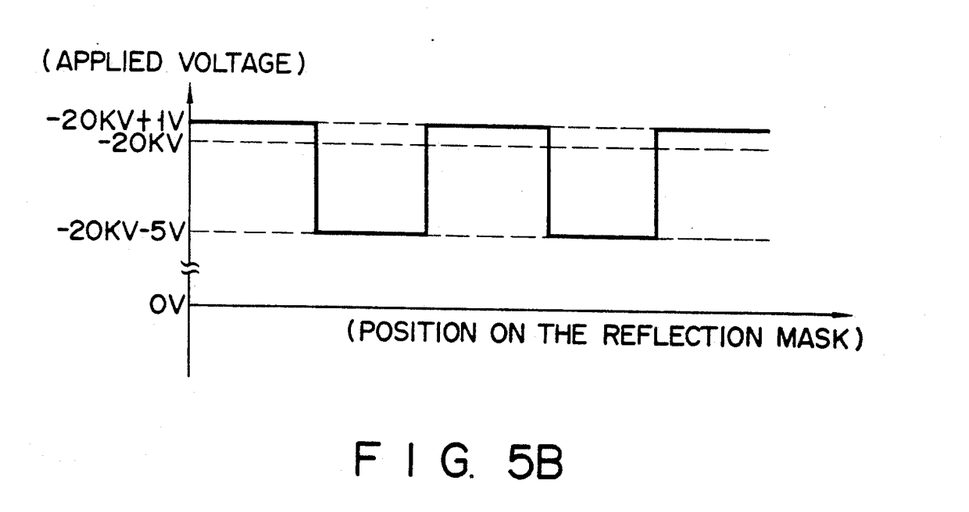

FIG. 5A is a cross-sectional view of the first embodiment of a reflection mask according to this invention, and FIG. 5B shows a characteristic chart of a voltage applied on the reflection mask as shown in FIG. 5A.

As shown in FIG. 5A, reflection patterns 220 made of polysilicon and having a T-shaped cross section are formed on a substrate 210 made of silicon. The top surface of each pattern 220 has a required pattern shape. Silicon oxide films 240 which are insulating films are formed on the rest portions of the surface of the substrate 210 on which the reflection patterns 220 are not formed. Non-reflection patterns 230 are formed on the silicon oxide films 220 such that the non-reflection patterns 230 are insulated from the reflection patterns 220. Voltages are applied on the reflection patterns 220 and the non-reflection patterns 230 such that the potentials become higher on the reflection patterns 220, electrically charged beams and the non-reflection patterns 230 in this order. The electrically charged beams are electron beams, for example. When the acceleration voltage is $-20$ kV, $-20$ kV $-5$ V may be applied to the reflection patterns 220, and $-20$ kV $+5$ V, to the non reflection patterns 230 (FIG. 5B). Actually, when an electron beam exposing apparatus is used, the potentials of the reflection patterns 220 and the non-reflection patterns 230 are adjusted by electing the cathode voltage as a reference voltage.

The silicon oxide films 240 are present between the reflection patterns 220 and the non-reflection pattern 230. Part of each silicon oxide film 240 extends to the rear face of the plate-like top portion of each reflection pattern 230 but does not extends outwardly therefrom. It should be noted that, if the silicon oxide film 240 extended outwardly from the plate-like top portion, electrically charged beams would be irradiated to the extended portion of the film 240 and electrical charges would be accumulated thereon, resulting in the distortion of the electric field or insulation breakdown.

It will now be explained how electrically charged beams such as electron beams travel when the beams are irradiated to the reflection mask 200.

The electrically charged beams are produced from an electrically charged beam irradiating unit (not shown in FIG. 5A) and shaped by an electrically charged beam shaping unit (not shown in FIG. 5A). The shaped beams are irradiated to the reflection patterns 220 as charged beams 201 and are irradiated to the non-reflection patterns 230 as another charged beams 202. Since the potential of the reflection patterns 220 is higher than the potential of the charged beam 202, a force directed in the direction opposite to the direction of the irradiation of the beams 201 is exerted on the electrically charged beams 201 at the reflection patterns 220. As a result, the part of the beams 201 is reflected in the direction opposite to the direction of the irradiation of them in the vicinity of the surface of each reflection pattern 220, for example, at the positions a little separated from the surface of each reflection pattern 220.

Since the potential of each non-reflection pattern 230 is lower than the potential of the electrically charged beams 201, contrary to the case in which the beams 201 is irradiated to the reflection patterns 220, a force directed in the direction of the irradiation of the beams 202 is applied to the beams 202 irradiated to the non-reflection patterns 230. As a result, the electrically charged beams 201 travel in the direction of the irradiation thereof and are not reflected.

Assume that the electrically charged beams are electron beams. Let the energy width of the electron beams be $\Delta V_0$ and the work functions of the materials of the reflection patterns 220 and the non-reflection patterns 230 be $\phi_1$ and $\phi_2$, respectively. The voltage difference $V_2$ between the voltage applied to the corresponding non-reflection patterns 230 and the voltage applied to the reflection patterns $V_1$ is adjusted such that a high contrast is obtained. When the materials of both patterns are the same, that is, when $\phi_1 = \phi_2$, the voltage difference is set such that $|V_2| \geq \Delta V_0$. On the other hand, when the materials are different, the voltage difference is set such that $|\phi_1 - \phi_2 + V_2| \geq \Delta V_0$. For example, the work functions for Si(n+), Pt and Ta are 4 eV, 5.4 eV and 4.1 eV, respectively. The energy width $\Delta V_0$ for an LaB 6 thermionic cathode electron gun and a Zr/W electric field electron gun are approximately 5 eV and 1.5 eV, respectively. When, therefore, the LaB$_6$ thermionic cathode electron gun is used and the reflection patterns 220 and the non-reflection patterns are made of Si, $V_2$ may be approximately 5 V. On the other hand, when a Zr/W thermionic electric field electron gun is used, where $\Delta V_0$ is small, even if $V_2$ is zero, the condition $|\phi_1 - \phi_2 + V_2| \geq \Delta V_0$ can be substantially satisfied when the materials of the reflection patterns 220 and the non-reflection patterns 230 are properly selected. For example, when the reflection patterns 220 are made of Ta and the non-reflection pattern 230 is made of Pt the potential of each non-reflection pattern 230 is higher by 5.4 V $-$ 4.1 V $=$ 1.3 V than the corresponding reflection pattern 220, whereby sufficient contrast is obtained. Further, when the reflection patterns 220 are made of Si(n+) and the non-reflection patterns 230 are made of Pt, the voltage difference between the non-reflection patterns 230 and the reflection patterns 220 is 5.4 V$\Delta$4 V $=$ 1.4 V. Thus, sufficient contrast is also obtained.

Accordingly, high contrast is obtained when the reflection mask according to this invention is used to expose a specimen in an electrically charged beam exposing apparatus, as explained later.

The reflection mask according to this invention is manufactured in the following ways:

FIGS. 6A to 6J show an embodiment of the steps of manufacturing the reflection mask. The parts and elements of the reflection mask in FIGS. 6A to 6J are shown by the same reference numerals as in FIG. 5, the detailed description thereof being omitted.

Figure 6A:
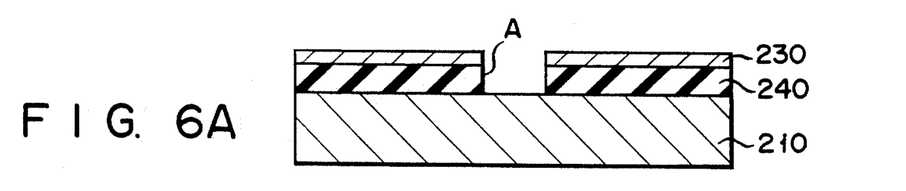
FIGS. 6A to 6J show the steps of manufacturing the reflection mask as shown in FIG. 5A.

After forming a silicon oxide film 240 and a polysilicon film 230 on the substrate 210 made of silicon in succession, connection holes A are formed for exposing the surface of the substrate 210 to the atmosphere (FIG. 6A).

Figure 6B:
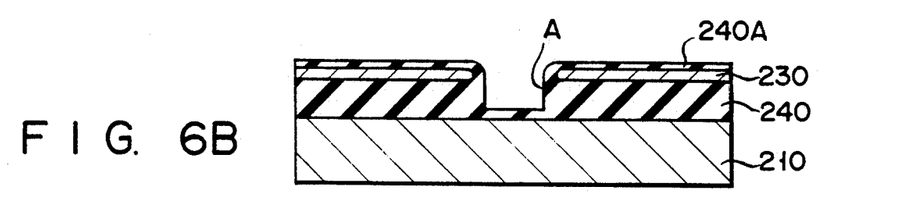

The whole area of the surface of the substrate 210 is thermally oxidized (FIG. 6B). A silicon dioxide film 240A is formed on the exposed surface of the substrate 210, and the surface of the polysilicon film 230 and the edges of the openings in the polysilicon film 230 are rounded. Since this step prevents the electric field from being concentrated on the edges of the openings when the voltage is applied on the polysilicon films (non-reflection patterns) 230 by using the reflection mask, insulation breakdown of the silicon oxide film 240 is avoided.

Figure 6C:
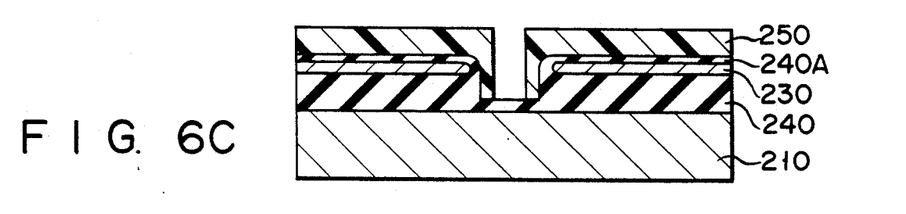
Figure 6D:
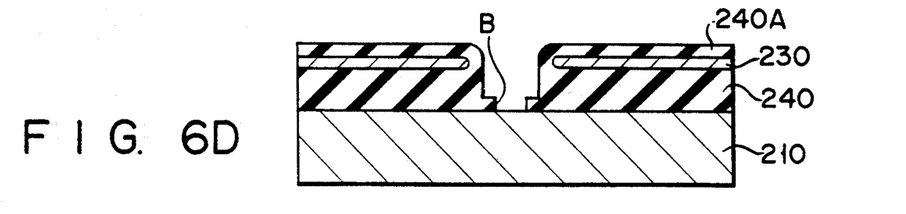

By performing exposure and development on a resist after the resist has been applied to the oxide film, the resist on the bottom of each connection opening A is partially removed (FIG. 6C). Etching is performed by using a resist pattern 250 as a mask so as to remove part of the resist on the bottom of the connection hole A. The portion of the silicon oxide film 240A on the bottom of the connection hole A is removed so as to open the connection hole A again (FIG. 6D).

Figure 6E:
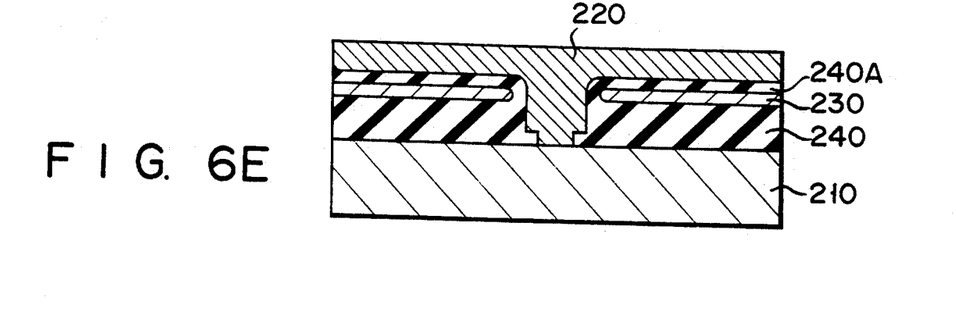

A polysilicon film 220 which later forms reflection patterns is deposited on the whole surface area of the substrate 210 by means of the CVD method (FIG. 6E). The resist is formed uniformly on the polysilicon film 220 and then the surface of the polysilicon film 220 is made flat by etch-back process such that the charged beams are reflected by the polysilicon film (the reflection pattern) 220 in the same direction, and thus the resolution of the mask patterns is prevented from being reduced.

Figure 6F:
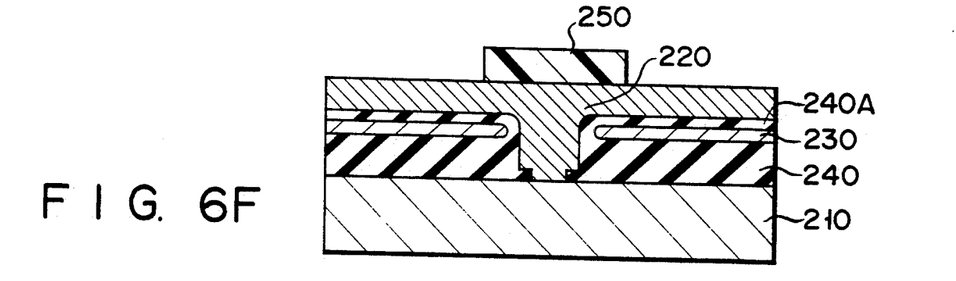
Figure 6G:
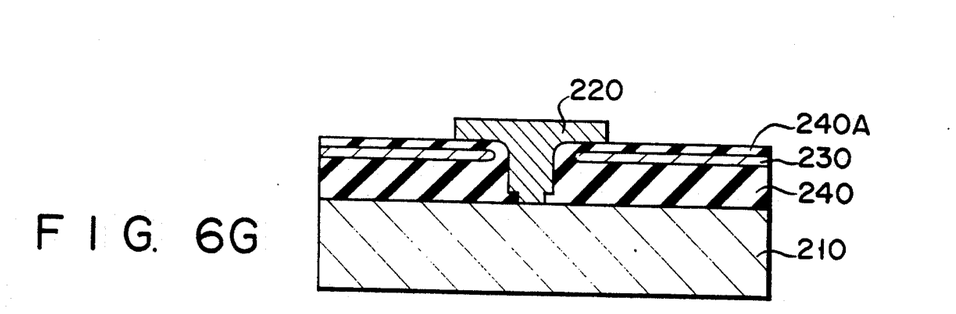

After a resist pattern 250 has been formed, anisotropic etching is performed by using the resist pattern 250 as a mask, and patterns are formed on the polysilicon film 220 (FIG. 6F). Thereafter, the resist pattern 250 is removed (FIG. 6G).

Figure 6H:
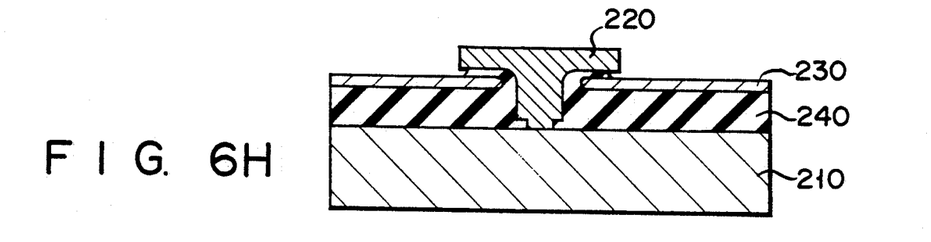

The silicon oxide film 240A is anisotropically etched by using the patterned polysilicon film 220 as a mask such that the surfaces of the polysilicon films 230 under the silicon oxide films 240A are exposed to the atmosphere (FIG. 6H). At the same time, the portion of each silicon oxide film 240A just under the outer peripheral portion of the corresponding polysilicon film (reflection pattern) 220 is exposed to the atmosphere. By doing so, the edge of the outer peripheral portion can be fully rounded in the next thermal oxidizing process. This prevents the concentration of the electric field at the outer peripheral portion of each reflection pattern 220 when the reflection mask is used.

Figure 6I:
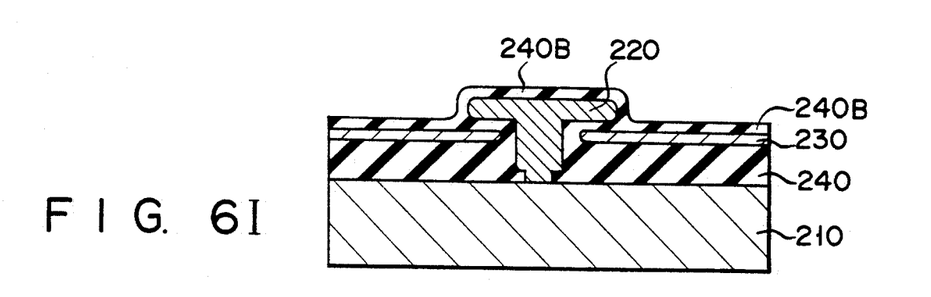

The whole surface of the substrate 210 is thermally oxidized and a silicon oxide film 240B is formed on the reflection patterns 220 and the non-reflection patterns 230, in order to prevent the concentration of the electric field on the edge of the outer peripheral portion of each reflection pattern 220 in a similar manner to FIG. 6B (FIG. 6I).

Figure 6J:
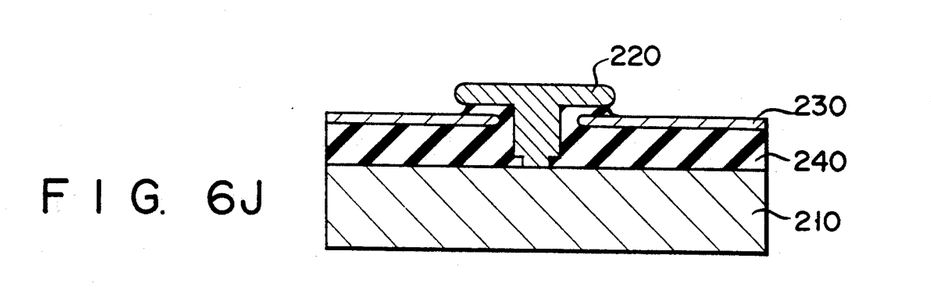

The silicon oxide film 240B and the portions of the silicon oxide films just under the outer peripheral portions of the reflection patterns 220 are removed by isotropic etching (FIG. 6J).

As the result of the steps shown in FIGS. 6A to 6J, charged beams have come to be irradiated to the silicon oxide film directly, thereby preventing charge-up at the silicon oxide film and insulation breakdown as well.

Instead of thermal oxidation in the step shown in FIG. 6I, the whole area of the substrate may be thermally oxidized after the step shown in FIG. 6G and then the step shown in FIG. 6J may be followed. The technical advantages obtained by these steps are the same as those obtained by the steps shown in FIGS. 6A to 6J.

The reflection mask according to this invention is manufactured by either series of the steps as mentioned above.

The first embodiment of an electrically charged beam exposing apparatus using a reflection mask according to this invention will now be explained in detail. The apparatus is an electron beam exposing apparatus.

Figure 7:
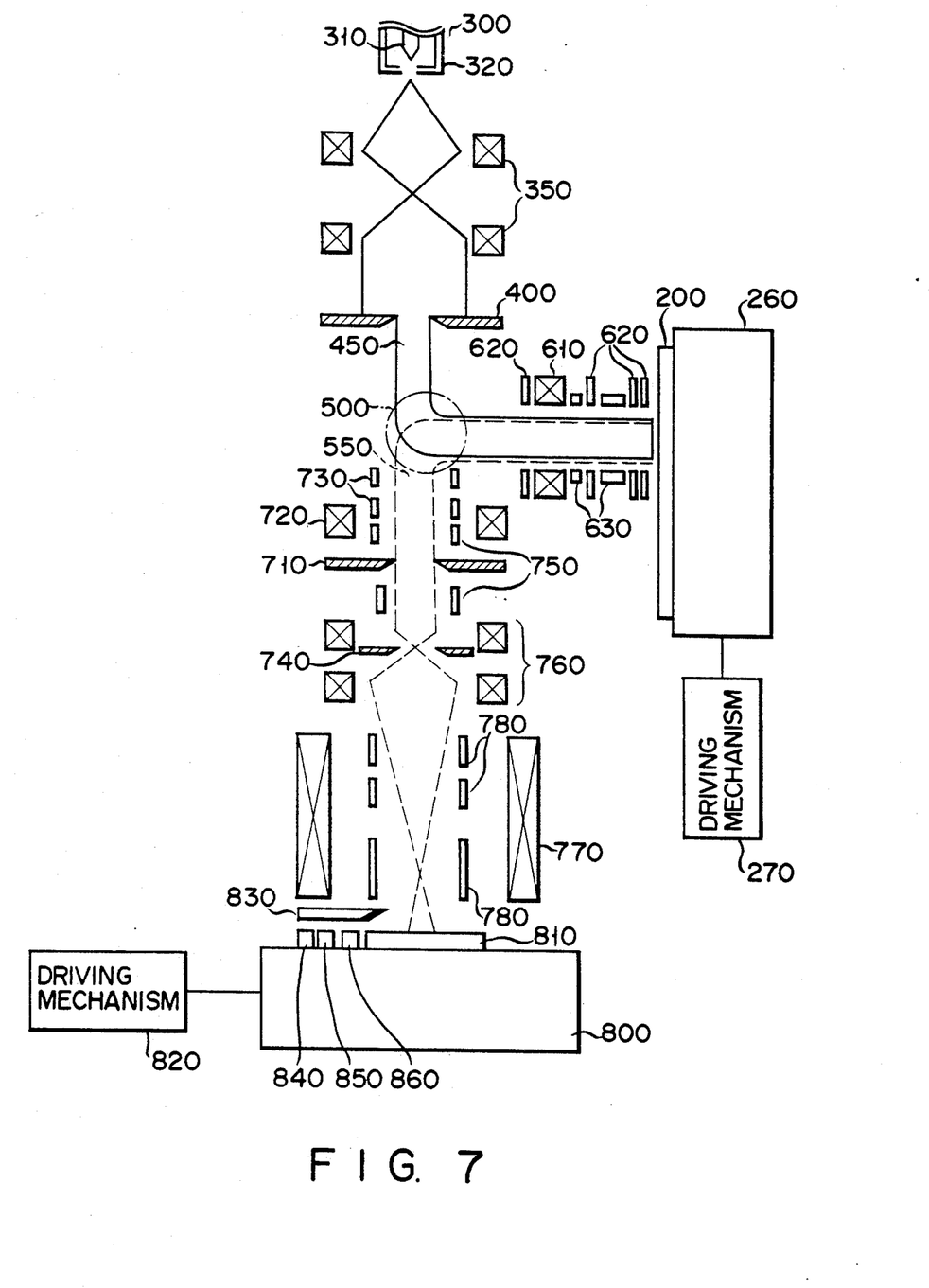
FIG. 7 is a schematic view of the conceptional structure of an embodiment of an electrically charged beam exposing apparatus according to this invention.

FIG. 7 is a schematic view of the structure of one embodiment of an electron beam exposing apparatus according to this invention. The exposing apparatus is provided on its upper portion with an electron gun 300 as an electron beam irradiating unit (an example of an electrically charged beam irradiating unit). The electron gun 300 has the same structure as the normal electron beam drawing device and comprises a cathode 310, an anode 320 and a control grid (not shown). It is assumed that a voltage of $-20$ kV is applied on the cathode 310 and the anode 320 is grounded. Electrons are accelerated between the cathode 310 and the anode 320 and are irradiated as electron beams from the electron gun 300. The electron beams irradiated from the electron gun 300 are rendered parallel by means of condenser lenses 350 which are provided along the path of the electron beams and then are incident on an aperture 400 forming an electron beam shaping unit (an example of an electrically charged beam shaping unit). The aperture 400 is designed to limit the irradiated area of the surface of the reflection mask 200. After passing through the aperture 400, the electron beams are formed into plano-parallel beams 450.

The plano-parallel beams 450 enter a deflector (electrically charged beam deflecting unit) 500 which generates a magnetic field perpendicular to the irradiating direction of the beams and is turned through 90°, 120° or another suitable angle by the electromagnetic force of the electric field as shown by the solid lines, by changing the intensity of the electromagnetic field.

The deflected electron beams are focused by means of an electromagnetic lens 610 and electrostatic lens electrodes 620 provided across the path of the deflected electron beams when the electron beams are incident on the reflection mask 200. The electron beams are incident on the required points on the surface of the reflection mask 200 by means of electrostatic octupole 630 provided across the path of the turned electron beams. The electrostatic lens electrodes 620 and the electrostatic octupole 630 are designed to correct the distortion of the electric field and the deflection errors on and in the vicinity of the surface of the reflection mask 200. The electrostatic octupole 630 functions as a deflector, distortion corrector, and abberation corrector. The reflection mask 200 is mounted on a support 260 moved by a moving mechanism 270. The movement of the reflection mask 200 made by the moving mechanism 270 selects the irradiated position on the surface of the reflection mask 200. The movement of the reflection mask 200 by the moving mechanism 270 causes the longitudinal, crosswise and slantwise displacements of the reflection mask 200 from the electron beams. However, these displacements are detected by a displacement detector (not shown) and corrected by the electromagnetic lenses 610, the electrostatic electrodes 620 and the electrostatic octupole 630.

The electron beams reflected by the reflection mask 200 travel on the path shown by the dotted lines and enters the deflector 500. The irradiating direction of the electron beams reflected by the reflection mask 200 is changed by means of the deflector 500 to the direction in the irradiating direction of the parallel electron beams 450. The electron beams thus changed are indicated at 550. The electron beams 550 pass through a lens 720 for focussing the electron beams on a shaping aperture 710, deflectors 730 for positioning the electron beams at the required portion of the shaping aperture 710, a blanking aperture 740, a blanking deflector 750, lenses 760 for reducing the cross-sectional area of the shaped electron beams, an objective lens 770 and deflectors 780 and arrive at a specimen 810.

The specimen 810 is placed on a specimen loader (a specimen setting unit) 800 moved by a moving mechanism 820. The specimen loader 800 is moved by the moving mechanism 820 such that the electron beams are irradiated to the required portion on the surface of the specimen 810.

In addition to the specimen 810, a Faraday cup 840, a beam positioning mark 850, and a beam detector 860 are provided on the specimen loader 800 such that the upper surfaces of the elements 810, 840, 850 and 860 are on the same plane. The electron beams incident on and reflected by the beam positioning mark 850 and the beam detector 860 are detected by a reflection beam detector 830.

Various forms of reflection patterns are arranged on the reflection mask 200. When two selected patterns are disposed close to each other, the positions of the surface of the reflection mask 200 to which the electron beams are irradiated are selected by the electrostatic octupole 630. When, however, the two selected patterns are separated from each other, the positions to be irradiated by the electron beams on the surface of the mask 200 are selected by the support 260 and the electrostatic octupole 630. With this arrangement, the electron beam reflected by the reflection mask 200 is shaped into a required configuration.

Since the shaping aperture 710 corresponds to the second aperture 110 of the conventional apparatus as shown in FIG. 1, the dimensions and shapes of the electron beams 550 can be changed by deflecting the electron beams 550 incident on the shaping aperture 710 by means of the deflectors 730.

When the pattern of the cell portion of the DRAM as shown in FIG. 3 is selected as the reflection pattern of the surface of the reflection mask 200 in this embodiment, the exposure time can be reduced to about 1/20 of the exposure time in the conventional apparatus.

Since the exposure is performed by using planoparallel beams in this invention, the exposure time is much smaller than the exposure time required for a point scanning exposure or exposure performed by using electrically charged beams whose cross-sectional shape is drawn by line beams.

Embodiment 2

The second embodiment of a reflection mask according to this invention and its manufacturing method will now be explained.

FIGS. 8A to 8G illustrate the steps of manufacturing a reflection mask of the second embodiment.

Figure 8A:
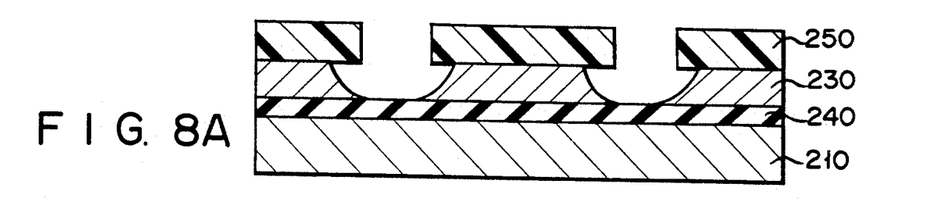
FIGS. 8A to 8G show the steps of manufacturing another embodiment of a reflection mask according to this invention.
Figure 8B:
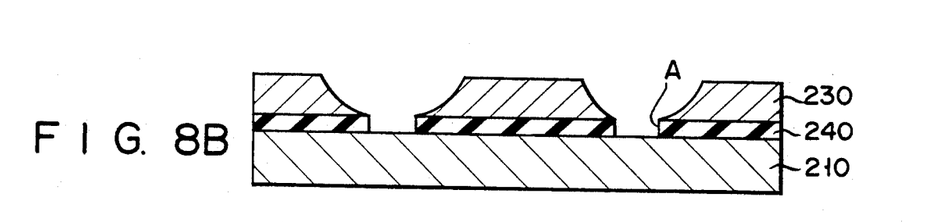
Figure 8C:
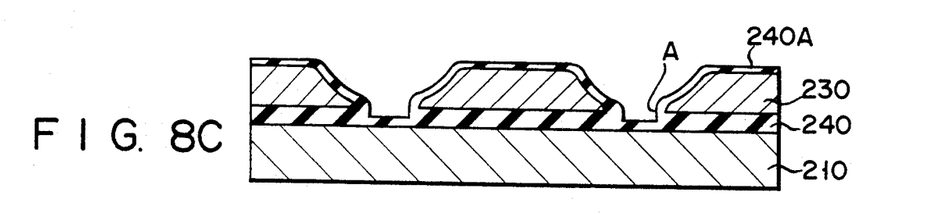
Figure 8D:
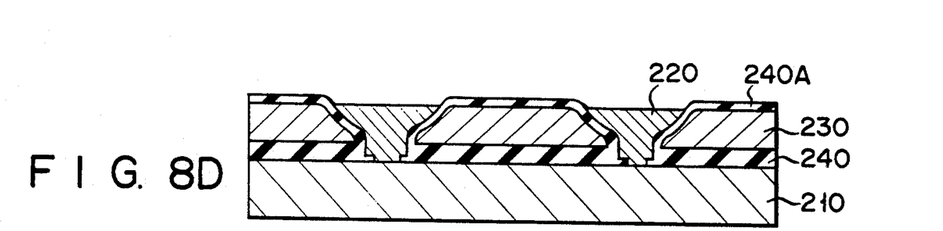
Figure 8E:
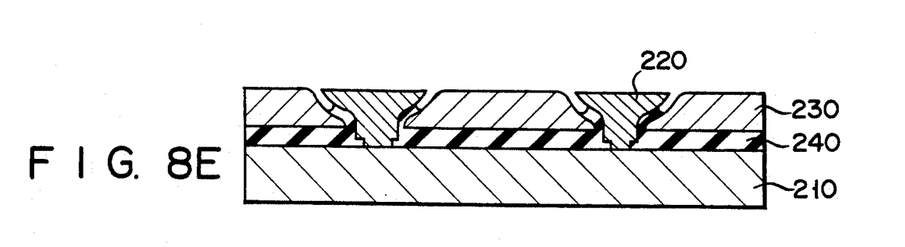
Figure 8F:
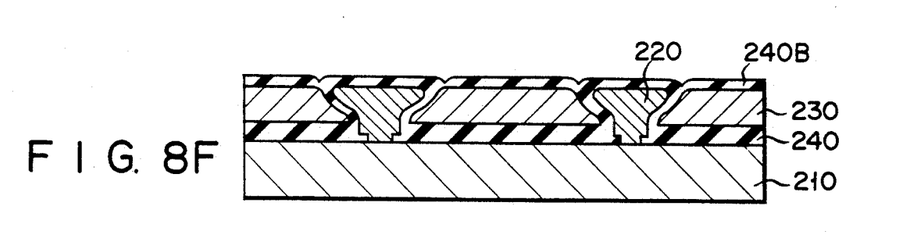
Figure 8G:
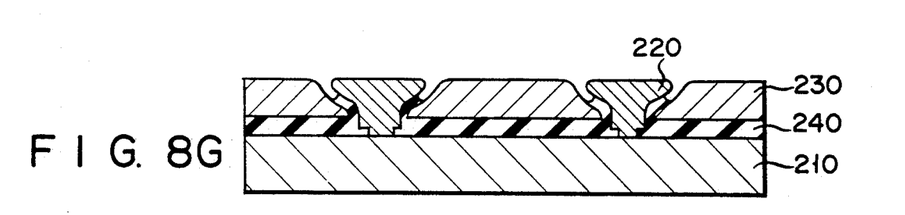

As shown in FIG. 8G, the reflection mask of the second embodiment comprises a substrate 210 made of silicon oxide films 240 formed on the substrate 210, non-reflection patterns 230 made of polysilicon and formed on the silicon oxide films 240, and reflection patterns 220 made of polysilicon. The structure of the reflection mask of the second embodiment is substantially the same as that of the first embodiment, except that the surfaces of the non-reflection patterns 230 and the reflection patterns 220 are on the same plane in the second embodiment.

The flush arrangement of the surfaces of the non-reflection patterns and the reflection patterns prevents the disturbance of the directions of the reflected electron beams at the peripheral portions of the reflection patterns 220, which disturbance occurs at the reflection patterns 220 of the first embodiment (FIG. 5A), whereby the deterioration of the resolution of the mask pattern is suppressed.

It will now be explained how to manufacture the reflection mask of the second embodiment.

After a silicon oxide film 240 has been formed on the substrate 210 and a polysilicon oxide film 230 is formed on the silicon oxide film 240, a resist pattern 250 is formed on the polysilicon oxide film 230 and then the polysilicon oxide film 230 is anisotropically etched by using the resist pattern 250 as a mask so as to form a non-reflection pattern (FIG. 8A).

The resist pattern 250 is removed and the silicon oxide mask 240 is anisotropically etched by using the polysilicon film 230 as a mask so as to form connection holes A through which the surface of the substrate 210 is exposed to the atmosphere (FIG. 8B).

The whole area of the substrate 210 is thermally oxidized (FIG. 8C). A silicon oxide films 240A is formed on the surface of the substrate 210 exposed to the atmosphere and the polysilicon oxide films 230, and the edges of the open portions of the polysilicon oxide films 230 are rounded as is in the case of the first embodiment.

The polysilicon oxide films 220 are formed in a similar manner to those of the first embodiment (FIG. 8D). The surfaces of the reflection patterns 220 may be flattened and the surfaces of the reflection patterns 220 and the upper surface of the polysilicon oxide films (the non-reflection patterns) 230 may be on the same plane.

The portions of the silicon oxide films 240 on the polysilicon films 230 and the portions of the silicon oxide films 240 just under the peripheral portions of the reflection patterns 220 are removed by isotropic etching (FIG. 8E) for the same reason as in the case of the first embodiment. The technical advantages are also the same as in the case of the first embodiment.

The whole area of the substrate 210 is again thermally oxidized (FIG. 8F). A silicon oxide film 240B is formed on the reflection patterns 220 and the nonreflection patterns 230, and the edges of the outer peripheral portions of the reflection patterns 220 are rounded as in the case of the first embodiment so as to prevent the concentration of the electric field at the edges.

The portions of the silicon oxide film 240B on the reflection patterns 220 and the non-reflection patterns 230 just under the outer peripheral portions of the reflection patterns 220 are removed (FIG. 8G). This removing process prevents charge-up from occurring at the silicon diode films 240 as in the case of the first embodiment.

In this embodiment, as in the case of the first embodiment, the whole area of the substrate 210 may be thermally oxidized after the step in FIG. 8D and then the step in FIG. 8G may be carried out. The reflection mask of the second embodiment is manufactured by either one series of the steps as mentioned above. The technical advantages achieved by the second embodiment are the same as those attained by the first embodiment.

Embodiment 3

The third embodiment of an electrically charged beam exposing apparatus using a reflection mask according to this invention will now be explained in detail. The apparatus is an electron beam exposing apparatus.

Figure 9:
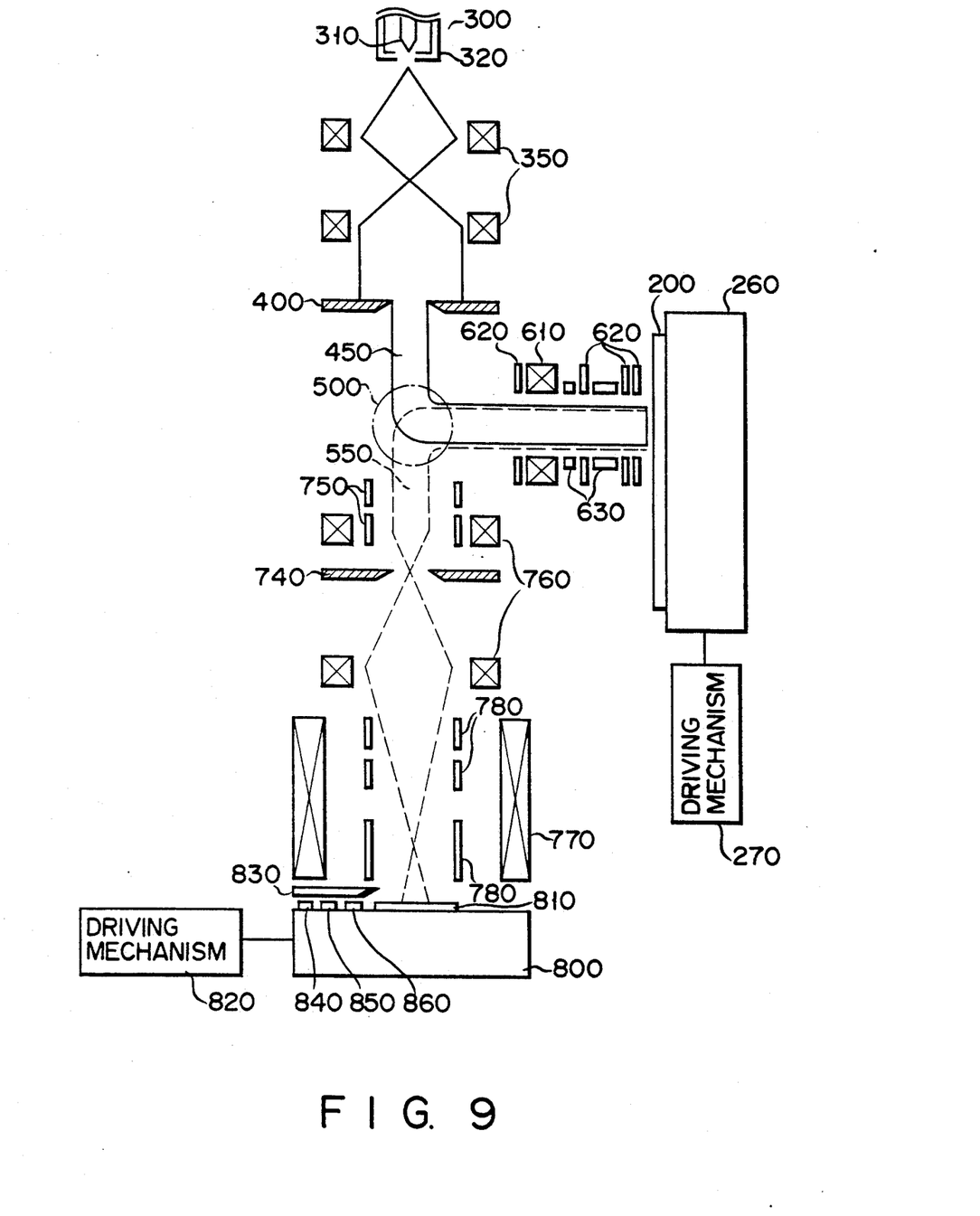
FIG. 9 is a schematic view of the conceptional structure of another embodiment of an electrically charged beam exposing apparatus according to this invention.

The outline of the structure of the third embodiment of the apparatus is shown in FIG. 9 in which the same parts and the elements of this embodiment as those of the first embodiment of the apparatus are designated by the same referential numerals. The differences of the first embodiment of the apparatus from the third embodiment of the apparatus will now be explained and the detailed description of the third embodiment will be omitted.

The third embodiment of the apparatus does not have a shaping aperture 710, a lens 720 for focussing electron beams on the aperture 710 or a deflector 730 for positioning electron beams at the required portion of the aperture 710.

Figure 10:
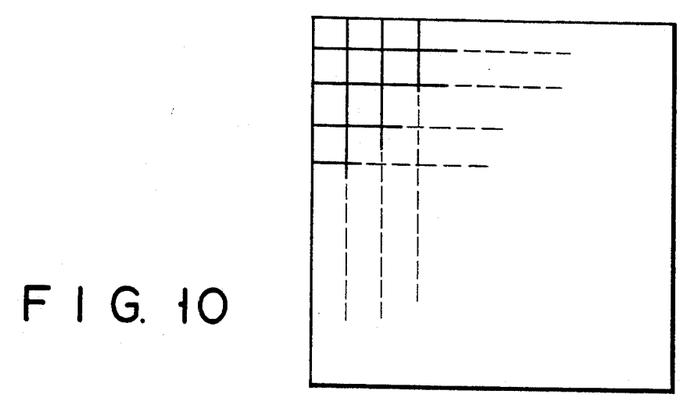
FIG. 10 illustrates how to perform exposure by dividing the mask and specimen area respectively by means of the electrically charged beam exposing apparatus as shown in FIG. 9.

It will now be explained how to perform exposure with this embodiment of the apparatus. FIG. 10 shows how to perform exposure by using the third embodiment of the apparatus. A pattern (not shown) having the same shape as a pattern of a chip is formed on the reflection mask 200. The latter pattern is divided into a plurality of latticed elements arranged at a constant pitch. The image of the pattern on the reflection mask 200 is projected on the surface of a specimen 810 as in case of an optical stepper.

The pitches change according to the acceleration voltages of electron beams incident on the surface of the specimen 810. The pitch dividing the chip pattern into divided areas is selected such that the intensity distribution of backscattered charged beam is rather constant with in. The pitches are 5 $\mu m$ for 20 kV and 20 to 30 $\mu m$ for 50 kV. The size of the aperture 400 is determined according to the pitch on the surface of the specimen 810 and the reduction rate of lens 770. The proximity effect thus can be corrected by controlling the exposure time for the corresponding divided element area. The element areas arranged on the surface of the reflection mask 200 are projected in succession onto the surface of the specimen 810.

With the third embodiment, no new pattern is generated, unlike the first embodiment. However, the exposure time is remarkably shortened in the third embodiment. When, for example, a chip of 20 mm×20 mm is divided into elements of 30 $\mu m \times 30$ $\mu m$, the exposure time per chip is 5 seconds or less, even with resist sensitivity=5 $\mu C/cm^2$ and a current density=0.5 $A/cm^2$. The exposure time of 5 seconds or less is 1/200 or less of the exposure time for the conventional apparatus. Further, it is almost unnecessary to perform pattern data processing in the apparatus. This makes the apparatus simple as compared with the conventional apparatus.

This invention is not limited to the above embodiments. For example, the surface of the reflection mask can be divided into smaller picture elements (pixel) and then a separate voltage can be applied to each picture element such that reflection beams having an arbitrary cross section are generated. This method enhances the exposure efficiency.

Figure 11A:
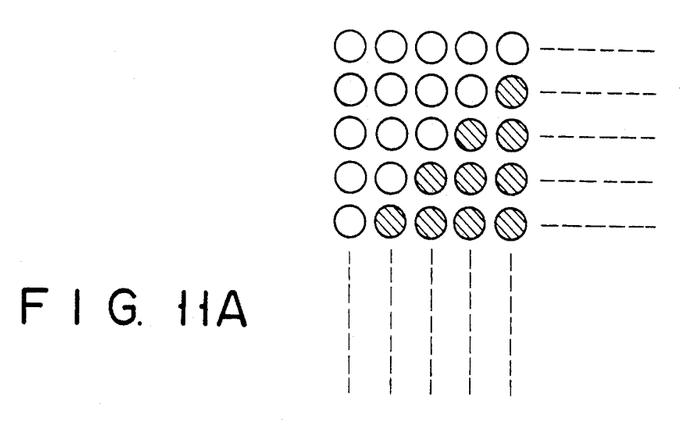
FIGS. 11A and 11B are views of another method of performing exposure by means of the reflection mask and the electrically charged beam exposing apparatuses according to this invention.
Figure 11B:
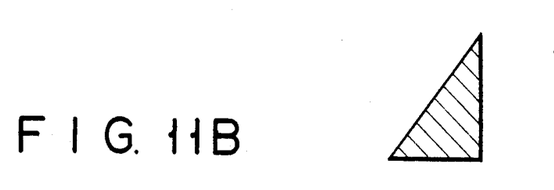

FIGS. 11A and 11B illustrate the above-mentioned method. As shown in FIG. 11A, a great number of circular pattern elements are arranged in a matrix form. A voltage is applied on the hatched pattern elements such that they form a reflection pattern. An electrically charged beam images formed by applying a voltage is reduced in size and projected on the surface of a specimen. In this way, a pattern having a require shape is exposed.

Electrically charged beams are not only electron beams but also other beams such as ion beams. When specific ion beams are to be irradiated, such ion means are selected from various ion beams irradiated from an ion source by passing through a massfilter.

In the apparatus, the electrostatic lenses may be replaced with electrostatic lens electrodes.

This invention is not limited to the above-mentioned embodiments but various modifications are available within scope of this invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A reflection mask comprising:
   a substrate having a surface comprising a selected portion and the other portion;
   a reflection pattern formed on said selected portion of said surface of said substrate;
   first voltage applying means for applying on said reflection pattern a voltage sufficient to reflect electrically charged beams irradiated to said reflection pattern;
   a non-reflection pattern provided on the other portion of said surface of said substrate; and
   second voltage applying means for applying on said non-reflection pattern a voltage sufficient to allow electrically charged beams to be incident on said non-reflection pattern.

2. The reflection mask according to claim 1, wherein said reflection pattern and said non-reflection pattern are arranged on the same plane perpendicular to said electrically charged beams.

3. An electrically charged beam exposing apparatus comprising:
   (a) electrically charged beam irradiating means for irradiating electrically charged beams;
   (b) electrically charged beam shaping means for shaping said electrically charged beams irradiated from said electrically charged beam irradiating means into a predetermined configuration;
   (c) a reflection mask illuminated with said electrically charged beams shaped by said electrically charged beam shaping means, said reflection mask comprising:
     (i) a substrate having a surface comprising a selected portion and the other portion;
     (ii) a reflection pattern formed on said selected portion of said surface of said substrate;
     (iii) first voltage applying means for applying on said reflection pattern a voltage sufficient to reflect electrically charged beams irradiated to said reflection pattern;
     (iv) a non-reflection pattern provided the other portion of said surface of said substrate; and
     (v) second voltage applying means for applying on said non-reflection pattern a voltage sufficient to allow electrically charged beams to be incident on said non-reflection pattern; and (d) a specimen loader on which a specimen irradiated by said electrically charged beams reflected by said reflection pattern is set.

4. The apparatus according to claim 3, further comprising:

electrically charged beam deflecting means provided between said electrically charged beam shaping means and said specimen loader, for deflecting said electrically charged beams;

a plurality of electromagnetic lenses disposed between said electrically charged beam deflecting means and said reflection mask;

a plurality of electrostatic lens electrodes disposed between said electrically charged beam deflecting means and said deflecting mask; and a plurality of electrostatic octupoles disposed between said electrically charged beam deflecting means and said deflected mask.

5. The apparatus according to claim 4. wherein said electrically charged beam deflecting means includes means for changing an irradiating direction of said electrically charged beams by 90°.

6. The apparatus according to claim 4, further comprising a moving mechanism for moving said reflection mask on a plane perpendicular to said irradiating direction of said electrically charged beams.

7. The apparatus according to claim 6, further comprising means for operating said electromagnetic lenses, said electrostatic lenses and said electrostatic octupoles so as to correct said electrically charged beam with the movement of said reflection mask moved by said moving mechanism.

8. An electrically charged beam exposing apparatus comprising:

electrically charged beam irradiating means for irradiating electrically charged beams;

electrically charged beam shaping means for shaping said electrically charged beams irradiated from said electrically charged beam irradiating means into a predetermined configuration;

electrically charged beam deflecting means provided in a path of said electrically charged beams shaped by said electrically charged beam shaping means, for deflecting said electrically charged beams;

a reflection mask on which said electrically charged beams are incident substantially perpendicularly to said reflection mask and which reflects said electrically charged beams having a predetermined shape in cross section to reenter said deflecting means; and a specimen loader for receiving a specimen on which said electrically charged beams reentering said electrically charged beams deflecting means and deflected thereby are incident.

9. The electrically charged beam exposing apparatus according to claim 8, wherein said electrically charged beam deflecting means includes means for changing an irradiating direction of said electron beams by 90°.

* * * * *